US012811545B2

(12) United States Patent
Lim et al.

(10) Patent No.: US 12,811,545 B2
(45) Date of Patent: Nov. 24, 2026

(54) MULTI-STAGE AMPLIFIER CIRCUITS

(71) Applicant: Samsung Electronics Co., Ltd., Suwon-si (KR)

(72) Inventors: Yong Lim, Suwon-si (KR); Jaehoon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 218 days.

(21) Appl. No.: 18/765,598

(22) Filed: Jul. 8, 2024

(65) Prior Publication Data

US 2025/0038711 A1 Jan. 30, 2025

(30) Foreign Application Priority Data

Jul. 25, 2023 (KR) ........................ 10-2023-0096904
Feb. 27, 2024 (KR) ........................ 10-2024-0028402

(51) Int. Cl.
*H03F 1/22* (2006.01)
*H03F 1/02* (2006.01)
*H03F 3/45* (2006.01)

(52) U.S. Cl.
CPC ....... *H03F 1/0244* (2013.01); *H03F 3/45264* (2013.01); *H03F 2200/18* (2013.01); *H03F 2203/45461* (2013.01)

(58) Field of Classification Search
CPC ............... H03F 1/22; H03F 1/305; H03F 1/30
See application file for complete search history.

(56) References Cited

U.S. PATENT DOCUMENTS 9,998,131 B1 6/2018 Kinyua et al.
10,979,064 B2 4/2021 Kinyua
11,128,269 B2 * 9/2021 Maalouf .............. H03F 1/0227
(Continued)

FOREIGN PATENT DOCUMENTS

CN 116054765 A 5/2023
KR 10-2510657 B1 3/2023
(Continued)

OTHER PUBLICATIONS

Y. Lim and M. P. Flynn, "A 100 MS/s, 10.5 Bit, 2.46 mW Comparator-Less Pipeline ADC Using Self-Biased Ring Amplifiers," in IEEE Journal of Solid-State Circuits, vol. 50, No. 10, pp. 2331-2341, Oct. 2015.
(Continued)

*Primary Examiner* — Henry Choe
(74) *Attorney, Agent, or Firm* — Fish & Richardson P.C.

(57) ABSTRACT

An amplifier includes a first stage amplifier circuit configured to receive an input voltage and a first multi-stage amplifier circuit and a second multi-stage amplifier circuit branching off from an output terminal of the first stage amplifier circuit and each including a second stage and a third stage. Each of the first multi-stage amplifier circuit and the second multi-stage amplifier circuit may be configured to sample a voltage corresponding to a first bias current corresponding to the second stage and a voltage corresponding to a second bias current corresponding to the third stage in a first phase, and bias the second stage with the voltage corresponding to the first bias current and bias the third stage with the voltage corresponding to the second bias current in a second phase.

20 Claims, 8 Drawing Sheets

(56) References Cited

U.S. PATENT DOCUMENTS

| | | | | |
|---|---|---|---|---|
| 11,539,336 | B2 | 12/2022 | Sun et al. | |
| 11,569,837 | B1 | 1/2023 | Akhavan et al. | |
| 11,855,587 | B2 * | 12/2023 | Soga | H03F 1/302 |
| 2019/0326857 | A1 * | 10/2019 | Tanaka | H03F 3/213 |
| 2020/0186094 | A1 * | 6/2020 | Kondo | H03F 3/19 |
| 2020/0358403 | A1 * | 11/2020 | Hase | H03F 3/211 |
| 2022/0337258 | A1 | 10/2022 | Shen et al. | |

FOREIGN PATENT DOCUMENTS

| | | | |
|---|---|---|---|
| KR | 10-2557684 | B1 | 7/2023 |
| WO | 2022/117200 | A1 | 6/2022 |

OTHER PUBLICATIONS

J. Lagos, B. Hershberg, E. Martens, p. Wambacq and J. Craninckx, "A Single-Channel, 600-MS/s, 12-b, Ringamp-Based Pipelined ADC in 28-nm CMOS," in IEEE Journal of Solid-State Circuits, vol. 54, No. 2, pp. 403-416, Feb. 2019.

B. Hershberg, N. Markuli?, J. Lagos, E. Martens, D. Dermit and J. Craninckx, "A 1-MS/s to 1-GS/s Ringamp-Based Pipelined ADC With Fully Dynamic Reference Regulation and Stochastic Scope-on-Chip Background Monitoring in 16 nm," in IEEE Journal of Solid-State Circuits, vol. 56, No. 4, pp. 1227-1240, Apr. 2021.

M. Zhan, L. Jie, X. Tang and N. Sun, "A 0.004mm2 200MS/S Pipelined SAR ADC with kT/C Noise Cancellation and Robust Ring-Amp," 2022 IEEE International Solid- State Circuits Conference (ISSCC), San Francisco, CA, USA, 2022, pp. 164-166.

G. Wegmann and E. A. Vittoz, "Analysis and improvements of accurate dynamic current mirrors," in IEEE Journal of Solid-State Circuits, vol. 25, No. 3, pp. 699-706, Jun. 1990.

Y. Lim and M. P. Flynn, "A calibration-free 2.3 mW 73.2 dB SNDR 15b 100 MS/s four-stage fully differential ring amplifier based SAR-assisted pipeline ADC," 2017 Symposium on VLSI Circuits, Kyoto, Japan, 2017, pp. C98-C99.

Extended European Search Report dated Nov. 12, 2024 for corresponding European Patent Application No. 24189380.9.

Y. Chen, Z. Ni, Y. Cao, F. Ye and J. Ren, "A 800 MS/s, 12-Bit, Ringamp-Based SAR assisted Pipeline ADC with Gain Error Cancellation," 2018 IEEE International Symposium on Circuits and Systems (ISCAS), Florence, Italy, 2018, pp. 1-4, doi: 10.1109/ISCAS.2018.8351074.

A. ElShater et al., "A 10-mW 16-b 15-MS/s Two-Step SAR ADC With 95-dB DR Using Dual-Deadzone Ring Amplifier," in IEEE Journal of Solid-State Circuits, vol. 54, No. 12, pp. 3410-3420, Dec. 2019, doi: 10.1109/JSSC.2019.2943935.

A. Sidun, M. Gaidukov, I. Piatak and Y. Belyaev, "Design of the Ring Amplifier for Low-Power ADC," 2018 IEEE International Conference on Electrical Engineering and Photonics (EExPolytech), St. Petersburg, Russia, 2018, pp. 69-73, doi: 10.1109/EExPolytech.2018.8564368.

Y. Lim et al., "9.2 A 2.08mW 64.4dB SNDR 400MS/s 12b Pipelined-SAR ADC using Mismatch and PVT Variation Tolerant Dynamically Biased Ring Amplifier in 8nm," 2024 IEEE International Solid-State Circuits Conference (ISSCC), San Francisco, CA, USA, 2024, pp. 170-172, doi: 10.1109/ISSCC49657.2024.10454422.

* cited by examiner

MULTI-STAGE AMPLIFIER CIRCUITS

CROSS-REFERENCE TO RELATED APPLICATIONS

This U.S. non-provisional application claims priority under 35 USC § 119 to Korean Patent Application Nos. 10-2023-0096904, filed on Jul. 25, 2023 and 10-2024-0028402 filed on Feb. 27, 2024, in the Korean Intellectual Property Office, the disclosures of each of which are herein incorporated by reference in their entirety.

BACKGROUND

Example embodiments relate to multi-stage amplifier circuits.

Various analog-to-digital converters (ADCs), such as a pipeline ADC, a pipeline successive approximation register (SAR) ADC, or a cyclic ADC, may include a switched capacitor (SC) amplifier. For example, an SC amplifier may be implemented using an operational transconductance amplifier (OTA), but OTAs typically have high power consumption, resulting in low power efficiency. Accordingly, it may be advantageous to provide an amplifier with lower power consumption to replace OTAs.

SUMMARY

Example embodiments provide multi-stage amplifier circuits for dynamic biasing.

According to some example embodiments, a multi-stage amplifier circuit includes a first multi-stage amplifier circuit and a second multi-stage amplifier circuit. The first multi-stage amplifier circuit may include a second stage N-type transistor connected to a first stage through a 1-1-th capacitor connected to a gate of the second stage N-type transistor, a bias N-type transistor connected to a drain of the second stage N-type transistor and having a gate connected to a 1-2-th capacitor, a third stage N-type transistor having a gate connected to the drain of the second stage N-type transistor, a first current circuit configured to supply a first bias current and a second bias current, and a first dynamic switching circuit connected to the second stage N-type transistor, the bias N-type transistor, the third stage N-type transistor, and the first current circuit and configured to sample a voltage corresponding to the first bias current across the 1-1-th capacitor in a first phase and sample a voltage corresponding to the second bias current across the 1-2-th capacitor based on forming a feedback loop comprising the bias N-type and the third stage N-type transistor. The second multi-stage amplifier circuit includes a second stage P-type transistor connected to the first stage through a 2-1-th capacitor connected to a gate of the second stage P-type transistor, a bias P-type transistor connected to a drain of the second stage P-type transistor and having a gate connected to a 2-2-th capacitor, a third stage P-type transistor having a gate connected to the drain of the second stage P-type transistor, a second current circuit configured to supply the first bias current and the second bias current, and a second dynamic switching circuit connected to the second stage P-type transistor, the bias P-type transistor, the third stage P-type transistor, and the second current circuit and configured to sample a voltage corresponding to the first bias current across the 2-1-th capacitor in the first phase and sample a voltage corresponding to the second bias current across the 2-2-th capacitor based on forming a feedback loop comprising the second stage P-type transistor, the bias P-type transistor, and the third stage P-type transistor.

According to some example embodiments, an amplifier includes a first stage amplifier circuit configured to receive an input voltage and a first multi-stage amplifier circuit and a second multi-stage amplifier circuit branching off from an output terminal of the first stage amplifier circuit and each including a second stage and a third stage. Each of the first multi-stage amplifier circuit and the second multi-stage amplifier circuit may be configured to sample a voltage corresponding to a first bias current corresponding to the second stage and a voltage corresponding to a second bias current corresponding to the third stage in a first phase, and bias the second stage with the voltage corresponding to the first bias current and bias the third stage with the voltage corresponding to the second bias current in a second phase.

According to some example embodiments, a differential amplifier includes a first stage amplifier circuit configured to receive a differential input voltage pair and a plurality of multi-stage amplifier circuits configured to output a differential voltage output pair for the differential input voltage pair. Each of the plurality of multi-stage amplifier circuits may include a first multi-stage amplifier circuit and a second multi-stage amplifier circuit branching off from an output terminal of the first stage amplifier circuit and each including a second stage and a third stage. Each of the first multi-stage amplifier circuit and the second multi-stage amplifier circuit are configured to sample a voltage corresponding to a first bias current corresponding to the second stage and a voltage corresponding to a second bias current corresponding to the third stage in a first phase, and may bias the second stage with the voltage corresponding to the first bias current and the third stage with the voltage corresponding to the second bias current in a second phase.

BRIEF DESCRIPTION OF DRAWINGS

The above and other aspects, features, and advantages of the present inventive concepts will be more clearly understood from the following detailed description, taken in conjunction with the accompanying drawings.

DETAILED DESCRIPTION

Hereinafter, example embodiments will be described with reference to the accompanying drawings.

Figure 1:
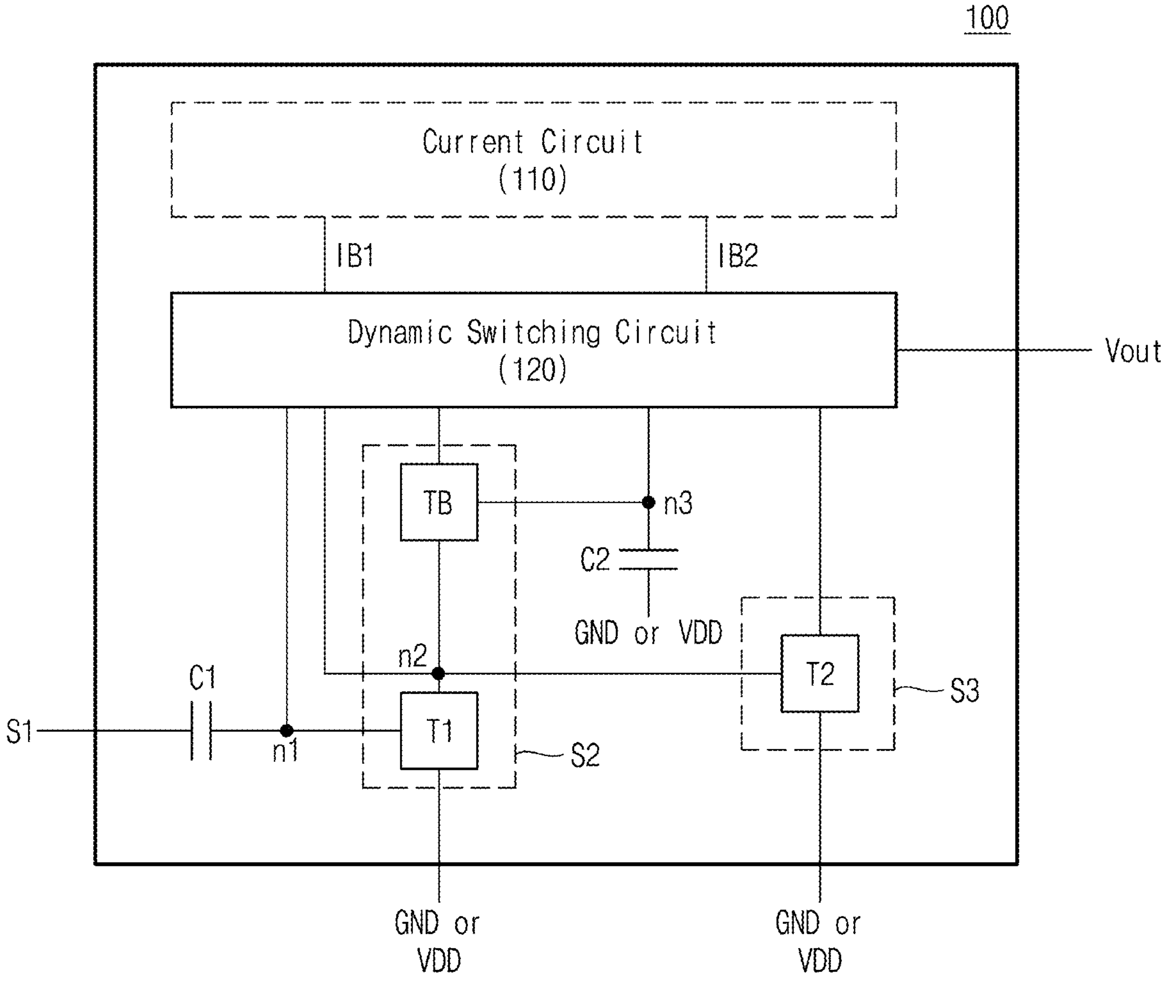
FIG. 1 is a diagram illustrating a multi-stage amplifier circuit according to some example embodiments.

FIG. 1 is a diagram of a multi-stage amplifier circuit according to some example embodiments.

Referring to FIG. 1, a multi-stage amplifier circuit 100 may be configured to amplify a signal provided from a first stage S1 and output an output voltage Vout based on the amplification. The first stage S1 may be an input stage configured to receive and amplify an input voltage. The multi-stage amplifier circuit 100 may include two stages. For ease of description, the two stages next to the first stage S1 and included in the multi-stage amplifier circuit 100 may be sequentially referred to as a second stage S2 and a third stage S3, respectively. The first stage S1, the second stage S2, and the third stage S3 may be connected in series.

The multi-stage amplifier circuit 100 according to some example embodiments may include a plurality of transistors, a plurality of capacitors, a current circuit 110, and a dynamic switching circuit 120. The plurality of transistors may include a second stage transistor T1, a bias transistor TB, and a third stage transistor T2. The second stage transistor T1 and the bias transistor TB may correspond to the second stage S2, and the third stage transistor T2 may correspond to the third stage S3.

The second stage S2 may be connected to the first stage S1 through a first node n1. A gate of the second stage transistor T1 included in the second stage S2 may be connected to the first capacitor C1 through the first node n1. For example, the second stage transistor T1 may be connected to the first stage S1 through the first capacitor C1 connected to the gate.

A drain of the second stage transistor T1 may be connected to the third stage S3 through a second node n2. For example, the drain of the second stage transistor T1 may be connected to a gate of the third stage transistor T2 through the second node n2. In some example embodiments, the drain of the second stage transistor T1 may be connected to a source of the bias transistor TB through the second node n2. In some example embodiments, the source of the second stage transistor T1 may be grounded or supplied with a supply voltage.

The bias transistor TB may have a source connected to the drain of the second stage transistor T1 through the second node n2, a gate connected to the second capacitor C2 and the dynamic switching circuit 120 through a third node n3, and a drain connected to the dynamic switching circuit 120. In some example embodiments, the second capacitor C2 may have one end connected to the third node n3 and the other end grounded or supplied with a supply voltage.

According to some example embodiments, the multi-stage amplifier circuit 100 may operate in a first phase and a second phase. The first phase may be defined as a phase for biasing each stage (the second stage S2 or the third stage S3) included in the multi-stage amplifier circuit 100, and the second phase may be defined as a phase for amplifying an input voltage and outputting the output voltage Vout based on each stage on which biasing preparation has been completed through the first phase. For example, the second phase may be a phase defined such that the multi-stage amplifier circuit 100 performs an amplification operation in a biased state. The first phase and the second phase may be non-overlapping phases.

In the first phase, the bias transistor TB and the dynamic switching circuit 120 may operate to sample a voltage corresponding to the first bias current IB1 provided from the current circuit 110 (hereinafter referred to as a "first bias voltage") for biasing to be described later. The second stage transistor T1 may operate based on a voltage biased in the second phase to perform an amplification operation.

The third stage transistor T2 included in the third stage S3 connected to the second stage may have a gate connected to the drain of the second stage transistor T1, the source of the bias transistor TB, and the dynamic switching circuit 120 through the second node n2, and a drain connected to the dynamic switching circuit 120 and the current circuit 110. In some example embodiments, the third stage transistor T2 may have a source grounded or supplied with a supply voltage. The third stage transistor T2 may be biased with a voltage corresponding to second bias current IB2 provided from the current circuit 110 (hereinafter referred to as a "second bias voltage") depending on the operations of the bias transistor TB and the dynamic switching circuit 120. The third stage transistor T2 may operate based on the voltage biased in the second phase to perform an amplification operation.

The current circuit 110 may be configured to supply first bias current IB1 and second bias current IB2. The term "supply" may refer to not only an operation of a current source providing bias current to the dynamic switching circuit 120, but also an operation of providing negative bias current to the dynamic switching circuit 120, for example, an operation of a current sink. For example, the current circuit 110 may operate as a current source or a current sink according to some example embodiments. The first bias current IB1 may have a value for a steady state operation of the second stage S2, and the second bias current IB2 may have a value for a steady state operation of the third stage S3.

According to some example embodiments, the current circuit 110 may be provided inside the multi-stage amplifier circuit 100 or outside the multi-stage amplifier circuit 100. The phrase "provided outside the multi-stage amplifier circuit 100" may refer to a phrase "provided outside an amplifier including the multi-stage amplifier circuit 100." For example, when the current circuit 110 is provided outside the multi-stage amplifier circuit 100, the current circuit does not affect the amplification operation of the multi-stage amplifier circuit 100, and thus may be made into a large element to address a mismatch issue of the current circuit 110.

The dynamic switching circuit 120 may be configured to perform dynamic switching operation according to the above-described first and second phases. The dynamic switching circuit 120 may be connected to the second stage transistor T1, the bias transistor TB, the third stage transistor T2, and the current circuit 110. The dynamic switching circuit 120 may receive the first bias current IB1 and the second bias current IB2 from the current circuit 110, and may sample the bias voltage such that each stage may operate with the bias voltage in the first phase for biasing.

In the first phase, the dynamic switching circuit 120 may be configured to sample the first bias voltage, generated by the bias current, to the first capacitor C1. For example, in the first phase, the dynamic switching circuit 120 may sample a voltage, required for the first bias current IB1 for biasing the second stage transistor T1, to one end of the second stage transistor T1 (for example, a side of the node n1).

In some example embodiments, in the first phase, the dynamic switching circuit 120 may be configured to sample the second bias voltage to the second capacitor C2 based on forming a feedback loop including the bias transistor TB, the second stage transistor T1, and the third stage transistor T2 and allowing the second bias current to flow through the third stage transistor T2. For example, the dynamic switching circuit 120 may form a feedback loop, including the bias transistor TB, the second stage transistor T1, and the third stage transistor T2, through the third node n3 depending on switching. The second bias voltage may be sampled across the second capacitor C2, connected to the third node n3, through the feedback loop.

In the second phase, the dynamic switching circuit 120 may be switched such that the biased second and third stages operate as an amplifier. The second and third stages may output an output voltage Vout based on an amplification operation.

For example, the dynamic switching circuit 120 may be configured to bias the second stage transistor T1 with the first bias voltage and the third stage transistor T2 with the second bias voltage in the second phase. For example, the dynamic switching circuit 120 may bias a gate voltage of the third stage transistor T2 (for example, a voltage at the second node n2) through the bias transistor TB to a voltage that is lower than the second bias voltage by a gate-source voltage of the bias transistor TB. In some example embodiments, the biasing may be performed based on the voltage sampled through the first phase.

According to some example embodiments, the dynamic switching circuit 120 may be configured to operate the bias transistor TB as a flipped voltage follower based on short-circuiting the drain of the bias transistor TB and the gate of the second stage transistor T1 in the first phase. Through the dynamic switching circuit 120, the bias transistor TB may operate as a flipped voltage follower. In some example embodiments, the bias transistor TB may output a voltage, which is lower than the second bias voltage sampled across the second capacitor C2 by the gate-source voltage of the bias transistor TB, through the second node n2 and the gate of the third stage transistor T2 may be applied with the voltage that is lower than the second bias voltage sampled across the second capacitor C2 by the gate-source voltage of the bias transistor TB. Accordingly, the third stage transistor T2 may then be biased with the second bias current IB2 in the second phase.

According to the above-described example embodiments, the multi-stage amplifier circuit 100 may dynamically bias each stage using transistors included in the second and third stages S2 and S3 through the dynamic switching circuit 120. For example, according to some example embodiments, operating current biasing required or advantageous for each stage may be performed using a transistor provided for amplification and the dynamic switching circuit 120 without additional calibration for biasing.

In some example embodiments, even when characteristics of the transistors provided in the multi-stage amplifier circuit 100 change due to process variation, operating current biasing required or advantageous for each stage may be performed.

Figure 2:
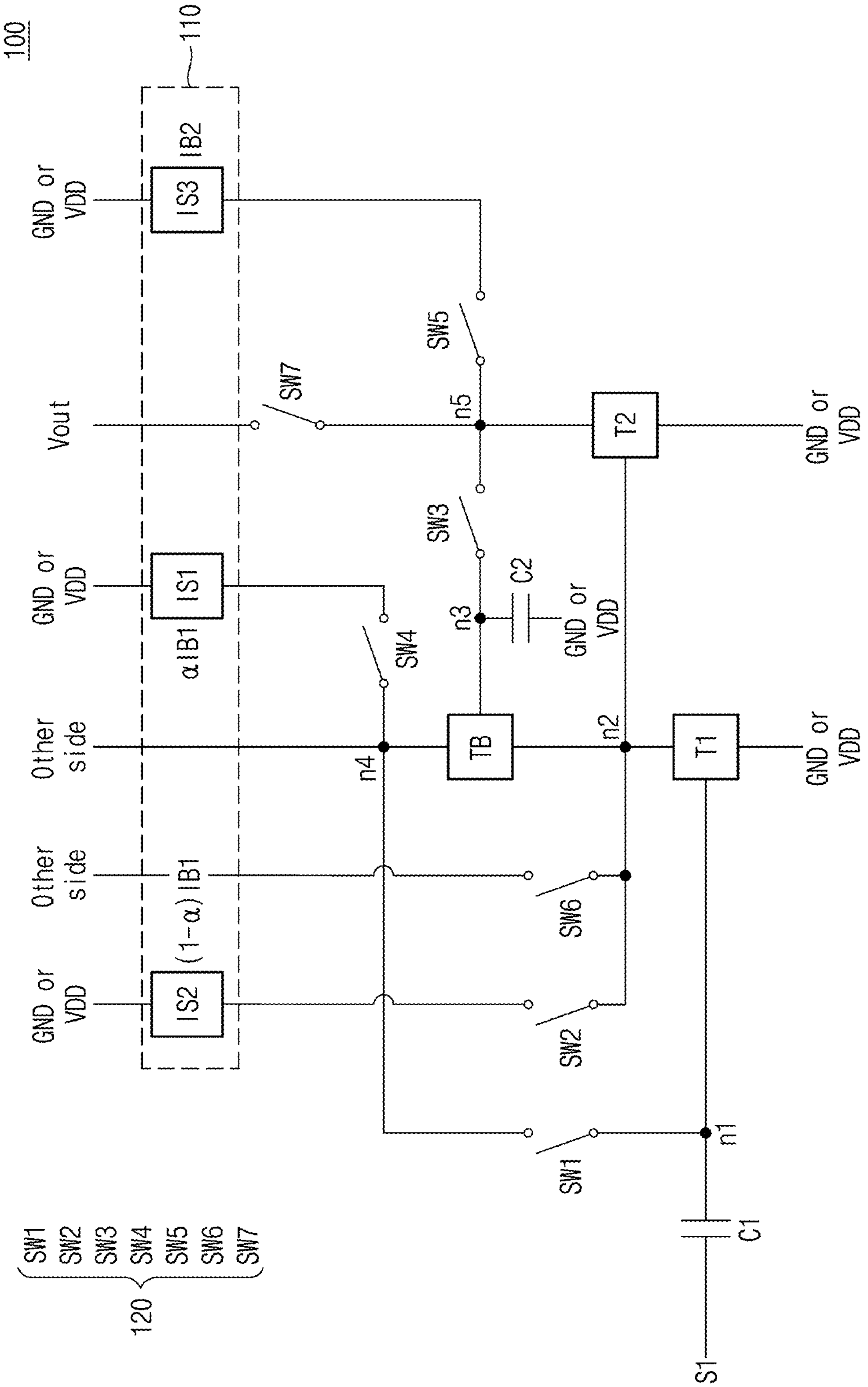
FIG. 2 is a circuit diagram of the multi-stage amplifier circuit of FIG. 1 according to some example embodiments.

FIG. 2 is a circuit diagram of the multi-stage amplifier circuit of FIG. 1 according to some example embodiments.

Referring to FIG. 2, the current circuit 110 may include a plurality of current sources IS1, IS2, and IS3. The plurality of current sources IS1, IS2, and IS3 may be connected to a power supply voltage, or may be grounded. The plurality of current sources IS1, IS2, and IS3 may be connected to the dynamic switching circuit 120 to supply bias current. The dynamic switching circuit 120 may receive first bias current IB1 and second bias current IB2 from the current circuit 110.

According to some example embodiments, the dynamic switching circuit 120 may include a first switch to a seventh switch SW1 to SW7. The first switch SW1 may be connected to the gate of the second stage transistor T1 and a drain of the bias transistor TB. For example, one end of the first switch SW1 may be connected to one end of the first capacitor C1 and the gate of the second stage transistor T1 through a first node n1, and the other end of the first switch SW1 may be connected to a first current source IS1 supplying a portion of first bias current IB1 through a fourth node n4. For example, the first current source IS1 may supply αIB1 (where $0<\alpha<1$) as a portion of the first bias current IB1.

The second switch SW2 may be connected to the drain of the second stage transistor T1, the gate of the third stage transistor T2, the source of the bias transistor TB, and the current circuit 110. For example, one end of the second switch SW2 may be connected to the source of the bias transistor TB and the drain of the second stage transistor T1 through the second node n2, and the other terminal of the second switch SW2 may be connected to the second current source IS2 supplying a portion of the first bias current IB1. For example, the second current source IS2 may supply $(1-\alpha)$IB1 as a portion of the first bias current IB1. For example, when $\alpha=\frac{1}{2}$, each of the first current source IS1 and the second current source IS2 may supply half of the first bias current IB1.

The third switch SW3 may be connected to the gate of the bias transistor TB, the second capacitor C2, and the drain of the third stage transistor T2. For example, one end of the third switch SW3 may be connected to the gate of the bias transistor TB and one end of the second capacitor C2 through the third node n3, and the other terminal of the third switch SW3 may be connected to the third current source IS3 and the drain of the third stage transistor T2 through a fifth node n5 and a fifth switch SW5. In some example embodiments, the other end of the third switch SW3 may be connected to the output terminal (for example, a terminal at which the output voltage Vout is output) through a seventh switch SW7.

The fourth switch SW4 may be connected to the first switch SW1, the drain of the bias transistor TB, and the first current source IS1. For example, one end of the fourth switch SW4 may be connected to the drain of the bias transistor TB and the first switch SW1 through the fourth node n4, and the other terminal of the fourth switch SW4 may be connected to the first current source IS1. In some example embodiments, one end of the fourth switch SW4 may be connected to a multi-stage amplifier circuit, not illustrated, on the other side.

The fifth switch SW5 may be connected to the drain of the third stage transistor T2 and the third current source IS3. For example, one end of the fifth switch SW5 may be connected to the third switch SW3, the seventh switch SW7, and the drain of the third stage transistor T2 through the fifth node n5, and the other end of the fifth switch SW5 may be connected to a third current source IS3.

One end of the sixth switch SW6 may be connected to the second node n2 through the second switch SW2, the drain of the second stage transistor T1, the source of the bias transistor TB, and the gate of the third stage transistor T2, and the other end of the sixth switch SW6 may be connected to a multi-stage amplifier circuit, not illustrated, on the other side.

One end of the seventh switch SW7 may be connected to the fifth node n5 through the third switch SW3, the fifth switch SW5, and the drain of the third stage transistor T2, and the other end of the seventh switch SW7 may be connected to the output terminal (for example, a terminal at which the output voltage Vout is output).

The first to fifth switches SW1 to SW5 may be configured to be turned on in the first phase and turned off in the second phase.

The first and third switches SW1 and SW3 may be configured to sample bias voltages across the first and second capacitors C1 and C2 while dynamically operating in the first and second phases.

The second switch SW2 may be turned on in the first phase and turned off in the second phase. The second switch SW2 may supply a portion of the first bias current (for example, (1−α)IB1) to the second node n2 based on being turned on in the first phase.

The fourth and fifth switches SW4 and SW5 may be turned on in the first phase and turned off in the second phase. The fourth switch SW4 may supply a portion of the first bias current (for example, αIB1) to the fourth node n4 based on being turned on in the first phase. The fifth switch SW5 may supply the second bias current (for example, IB2) to the fifth node n5 based on being turned on in the first phase.

When the first to fifth switches SW1 to SW5 are turned on, the first and fourth nodes n1 and n4 may be connected to each other, and a portion of the first bias current may be supplied to the fourth node n4 through the first current source IS1 and a portion of the first bias current may be supplied to the second node n2 through the second current source IS2. In some example embodiments, the third and fifth nodes n3 and n5 may be connected to each other, and the second bias current IB2 may be supplied to the fifth node n5.

The second stage transistor T1 may have a drain connected to the first node n1 through the bias transistor TB and the first switch SW1 and may receive a portion of the first bias current from each of the first and second current sources IS1 and IS2, and the third stage transistor T2 may receive the second bias current IB2. Accordingly, the first bias voltage may be sampled across the first capacitor C1 connected to the second stage transistor T1, and the second bias voltage may be sampled across the second capacitor C2 connected to the third stage transistor T2.

The fourth switch SW4 and the fifth switch SW5 may be turned off in the second phase to block the supply of current from the first and third current sources IS1 and IS3. Similarly, the second switch SW2 may also be turned off in the second phase to block the supply of current from the second current source IS2. For example, an unused current circuit may be turned off through the second, fourth, and fifth switches SW2, SW4, and SW5 in the second phase to reduce current consumption. In some example embodiments, the current circuit may be implemented outside the multi-stage amplifier circuit 100 through the second, fourth, and fifth switches SW2, SW4, and SW5, so that the current circuit does not affect the amplification operation of the multi-stage amplifier circuit 100, and thus may be made into a large element to reduce a mismatch issue.

The sixth to seventh switches SW6 to SW7 may be turned off in the first phase and turned on in the second phase. When the sixth to seventh switches SW6 to SW7 are turned on in the second phase, the multi-stage amplifier circuit 100 may be connected to another multi-stage amplifier circuit, not illustrated, to perform an amplification operation and output the output voltage Vout.

A plurality of current sources included in the current circuit 110 may include the first to third current sources IS1 to IS3 to supply bias current to the dynamic switching circuit 120 including the first to seventh switches SW1 to SW7. The first current source IS1 may be connected to one end of the fourth switch SW4 and may supply a portion of the first bias current. The second current source IS2 may be connected to one end of the second switch SW2 and may also supply a portion of the first bias current. The third current source IS3 may be connected to one end of the fifth switch SW5 and may supply the second bias current (for example, IB2).

Hereinafter, the operations of the first and second phases of the multi-stage amplifier circuit 100 according to some example embodiments will be described in more detail based on the components included in the above-described multi-stage amplifier circuit 100.

According to some example embodiments, the multi-stage amplifier circuit 100 may be implemented to secure stability for an amplifier, which may include the multi-stage amplifier circuit 100, and to operate with low power.

The multi-stage amplifier circuit 100 may be configured to operate as a one-pole system to achieve stability. For example, the one-pole system may be implemented using a Miller compensation capacitor. When the compensation capacitor is formed in the second stage, a dominant pole may be formed at the output node of the first stage, and poles of the output nodes of the second and third stages next to the first stage may be moved to a higher frequency. Accordingly, the stability of the amplifier may be improved, but high power consumption may be required as a load increases due to the compensation capacitor formed in the second and third stages and the load capacitor formed in the third stage.

Accordingly, the multi-stage amplifier circuit 100 according to some example embodiments may be configured to significantly reduce the load on the output nodes of the first and second stages and, instead, to form a dominant pole at the output node of the third stage. In some example embodiments, the amplifier may secure stability and operate with low power.

According to some example embodiments, it may be advantageous to reduce sizes of the second stage transistor T1, the bias transistor TB, and the third stage transistor T2 to significantly reduce the load on the output nodes of the first and second stages S1 and S2.

According to some example embodiments, it may be advantageous to increase output impedance of the third stage S3 to form a dominant pole in the third stage S3. For example, it may be advantageous to bias the third stage transistor T2 for the third stage transistor T2 to operate in a sub-threshold region such that the output impedance of the third stage S3 is increased. To bias the sub-threshold region for the third stage transistor T2, the source of the bias transistor TB may be connected to the drain of the second stage transistor T1 and a transistor of each stage may be biased to an appropriate voltage for the sub-threshold region using the bias transistor TB and the dynamic switching circuit 120. In some example embodiments, the first bias current IB1 and the second bias current IB2 for biasing may also have values for operating the third stage transistor T2 in the sub-threshold region.

As the first to third switches SW1 to SW5 are turned on in the first phase, the first and fourth nodes n1 and n4 may be connected to each other, the second current source IS2 may be connected to the second node n2, and the third and fifth nodes n3 and n5 may be connected to each other. For example, the drain of the bias transistor TB and the gate of the second stage transistor T1 may be short-circuited through the first switch SW1. The first current source IS1 may supply a portion of the first bias current to the fourth node n4, and the second current source IS2 may supply a portion of the first bias current to the second node n2.

Then, in some example embodiments, the second stage transistor T1 may be connected to the drain and gate through the bias transistor TB, and may receive a portion of the first bias current from each of the first and second current sources IS1 and IS2. A voltage required for the second stage transistor T1 to flow the first bias current may be sampled across the first capacitor C1 connected to the first node n1 and the fourth node n4. Accordingly, voltage sampling for biasing the second stage transistor T1 may be performed through the first phase.

As the fifth switch SW5 is turned on, the third current source IS3 may supply the second bias current IB2 to the drain of the third stage transistor T2 through the fifth node n5. In some example embodiments, as the third switch SW3 is turned on, a voltage required for the third stage transistor T2 to flow the second bias current may be sampled across the second capacitor C2 connected to the fifth node n5 (and the third node n3). Accordingly, voltage sampling for biasing the third stage transistor T2 may also be performed through the first phase.

According to some example embodiments, in the first phase, the bias transistor TB may operate as a flipped voltage follower through the dynamic switching circuit 120. For example, the bias transistor TB may operate as a flipped voltage follower using a portion of the first bias current supplied to the drain as a reference current source and the first bias current IB1 flowing through the source as a current sink. In some example embodiments, when the first switch SW1 is turned on, the bias transistor TB and the second stage transistor T1 may operate as a flipped voltage follower. Accordingly, the bias transistor TB may output a voltage, decreased by the gate-source voltage of the bias transistor TB from the second bias voltage sampled across the second capacitor C2, to the second node n2.

For example, as the first to fifth switches SW1 to SW5 included in the dynamic switching circuit 120 are turned on, a feedback loop including the second stage transistor T1, the bias transistor TB, and the third stage transistor T2 may be formed and the second bias voltage may be sampled across the second capacitor C2. At the same time, the bias transistor TB and the second stage transistor T1 may operate as flipped voltage followers to output the sampled second bias voltage to the second node n2, for example, the gate of the third stage transistor T2. The third stage transistor T2 may be applied with a voltage that is lower than the second bias voltage by the gate-source voltage of the bias transistor TB, and the third stage transistor T2 may flow the second bias current IB2 based on the biasing. In some example embodiments, the third stage transistor T2 may operate in the sub-threshold region as the third stage transistor T2 is biased with the second bias current IB2.

Then, in some example embodiments, when the first to fifth switches SW1 to SW5 are turned off in the second phase, the second and third stages S2 and S3 may perform amplification operations based on biasing. In some example embodiments, the second stage transistor T1 may flow the first bias current IB1 based on the biasing, and the third stage transistor T2 may flow the second bias current IB2 based on the biasing. As a result, according to the above-described example embodiments, the multi-stage amplifier circuit 100 may operate as a current mirror dynamically operating in the first phase, across the first and second phases. In the first phase, the multi-stage amplifier circuit 100 may sample the bias voltage corresponding to the mirrored current on each capacitor. In the second phase, the multi-stage amplifier circuit 100 may bias the second stage transistor T1, the bias transistor TB, and the third stage transistor T2 with the sampled bias voltage. Accordingly, the mirrored first bias current may flow through the second stage transistor T1, and the mirrored second bias current may flow through the third stage transistor T2.

According to the above-described example embodiments, the multi-stage amplifier circuit 100 may bias each of the second and third stages as the first to fifth switches SW1 to SW5 connected to the second stage transistor T1, the bias transistor TB, and the third stage transistor T2 are turned on in the first phase. For example, the third stage transistor T2 may be biased to operate in the sub-threshold region, and thus the multi-stage amplifier circuit 100 may stably operate with low power.

In some example embodiments, the multi-stage amplifier circuit 100 may be biased without an element added to, for example, the third stage by operating as a current mirror that operates dynamically. When an element for mirroring is added to the third stage, a frequency of a pole corresponding to the output node of the second stage may be decreased, but the above issue may be prevented or reduced according to the example embodiments.

Figure 3:
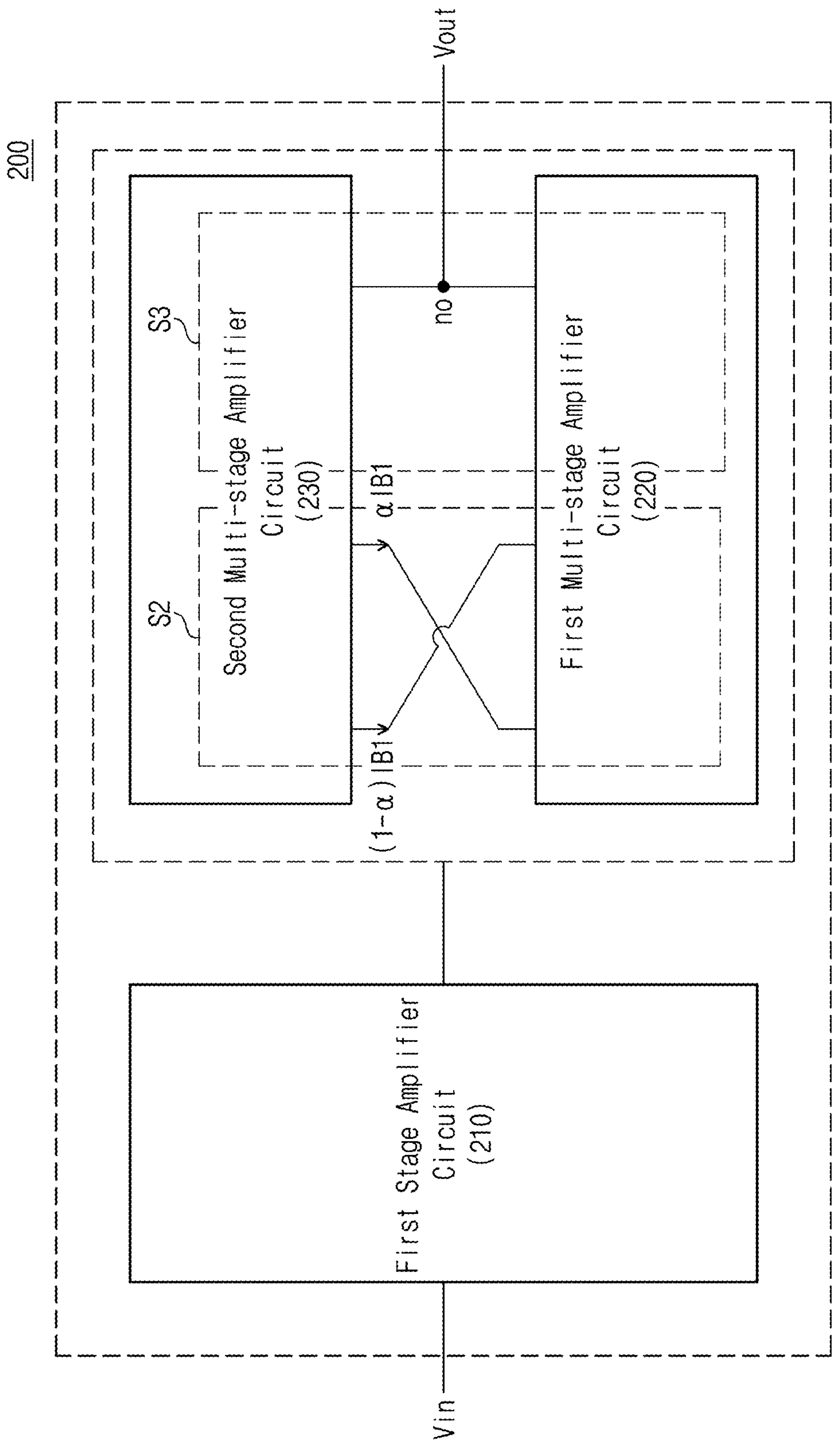
FIG. 3 is a diagram illustrating an amplifier according to some example embodiments.

FIG. 3 is a diagram illustrating an amplifier according to some example embodiments.

Referring to FIG. 3, the amplifier 200 may include a first stage amplifier circuit 210, a first multi-stage amplifier circuit 220, and a second multi-stage amplifier circuit 230.

The first stage amplifier circuit 210 may be applied with an input voltage Vin. For example, the first stage amplifier circuit 210 may be configured to receive an input voltage Vin. The first stage amplifier circuit 210 may amplify the input voltage Vin based on a gain. For example, the first stage amplifier circuit 210 may be implemented as an inverter. The first stage amplifier circuit 210 may be connected to the first multi-stage amplifier circuit 220 and the second multi-stage amplifier circuit 230.

The first multi-stage amplifier circuit 220 and the second multi-stage amplifier circuit 230 may branch off from an output stage of the first stage amplifier circuit 210, and may each include a second stage S2 and a third stage S3. The first multi-stage amplifier circuit 220 and the second multi-stage amplifier circuit 230 may be connected to each other through a dynamic switching circuit, as will be described later. For example, the first multi-stage amplifier circuit 220 and the second multi-stage amplifier circuit 230 may be connected to each other in the second phase, allowing a portion of the first bias current to flow through each of the two paths. In some example embodiments, the first multi-stage amplifier circuit 220 and the second multi-stage amplifier circuit 230 may output an output voltage Vout through the output node no in the second phase.

According to some example embodiments, each of the first multi-stage amplifier circuit 220 and the second multi-stage amplifier circuit 230 may sample a voltage corresponding to the first bias current IB1 corresponding to the second stage S2 and a voltage corresponding to the second bias current IB2 corresponding to the third stage S3 in the first phase. In some example embodiments, each of the first multi-stage amplifier circuit 220 and the second multi-stage amplifier circuit 230 may be configured to bias the second stage S2 with the voltage corresponding to the first bias current IB1 and to bias the third stage S3 with the voltage corresponding to the second bias current IB2.

Hereinafter, various example embodiments of the amplifier of FIG. 3 will be described with reference to FIGS. 4 to 7.

Figure 4:
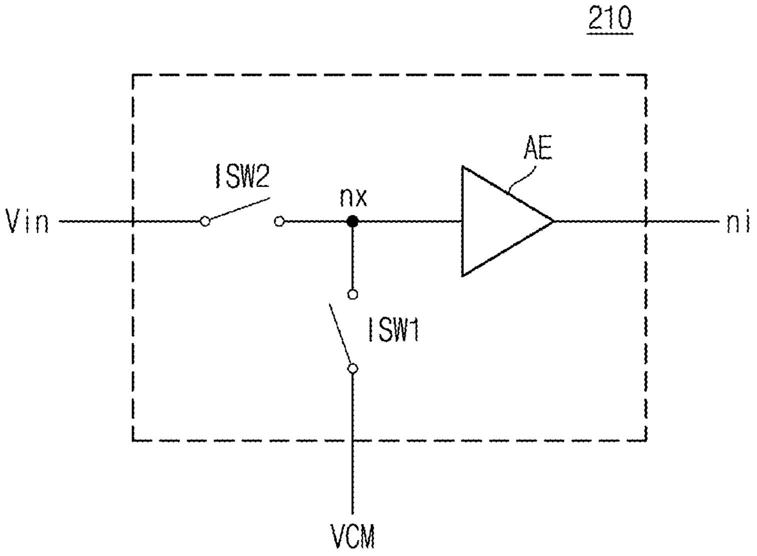
FIG. 4 is a circuit diagram of a first stage amplifier circuit according to some example embodiments.

FIG. 4 is a circuit diagram of a first stage amplifier circuit according to some example embodiments.

Referring to FIG. 4, the first stage amplifier circuit 210 may include an amplifying element AE, a first input switch ISW1, and a second input switch ISW2.

An input terminal of the amplifying element AE may be connected to the first input switch ISW1 and the second input switch ISW2 through a node x (nx), and the output terminal may be connected to an input node i (ni). The amplifying element AE may amplify an input voltage Vin, applied from the node x (nx) through the second input switch ISW2, by a gain required in the first stage, and may output the amplified voltage to the input node i (ni). For example, the amplifying element AE may be implemented as an operational transconductance amplifier (OTA) or an inverter-type OTA.

The first input switch ISW1 may be connected to node x (nx) to apply a common mode voltage VCM to the node x (nx). The first input switch ISW1 may be turned on in the first phase to apply the common mode voltage VCM to the amplifying element AE. Since the node i (ni) is connected to the first multi-stage amplifier circuit and the second multi-stage amplifier circuit as described above, an output common mode voltage of the first stage amplifier circuit 210 and an output offset of the first stage amplifier circuit 210 itself may be applied to the first multi-stage amplifier circuit 220 and the second multi-stage amplifier circuit 230 in the first phase. The first input switch ISW1 may be turned off in the second phase.

The second input switch ISW2 may be connected to the node x (nx), and may apply the input voltage Vin to the node x (nx). The second input switch ISW2 may be turned off in the first phase. The second input switch ISW2 may be turned on in the second phase to apply the input voltage Vin to the amplifying element AE. Accordingly, in the second phase for amplification, the amplifying element AE may amplify the applied input voltage Vin by the gain and output the amplified input voltage to the input node i (ni).

Figure 5:
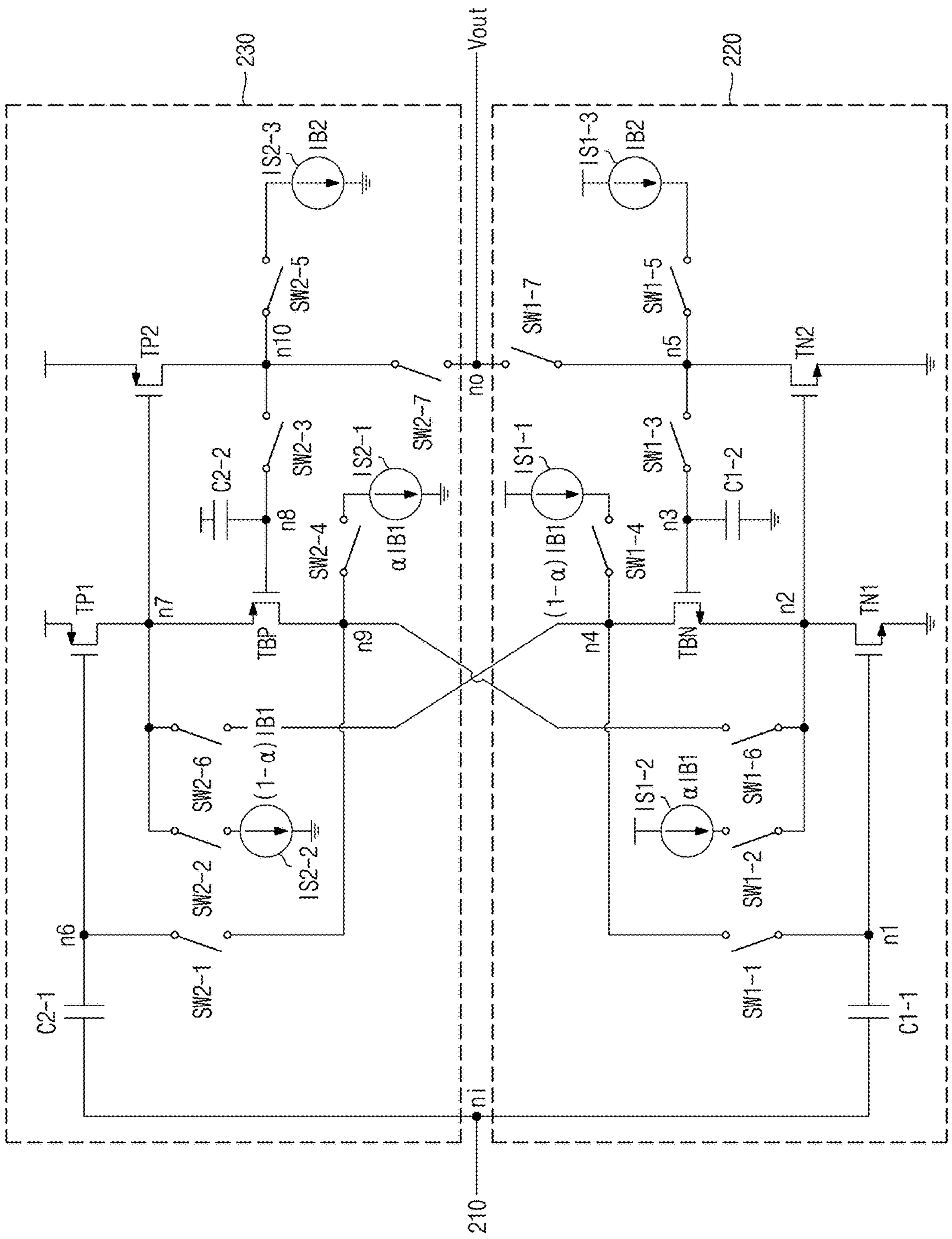
FIG. 5 is a diagram illustrating a first multi-stage amplifier circuit and a second multi-stage amplifier circuit according to some example embodiments.

FIG. 5 is a diagram illustrating a first multi-stage amplifier circuit and a second multi-stage amplifier circuit according to some example embodiments.

Referring to FIG. 5, a first multi-stage amplifier circuit 220 and a second multi-stage amplifier circuit 230 may each be implemented based on the multi-stage amplifier circuit according to some example embodiments described in FIGS. 1 to 3.

For example, the first multi-stage amplifier circuit 220 may include a second stage N-type transistor TN1, a third stage N-type transistor TN2, and a bias N-type transistor TBN. The term “N-type” is used to distinguish elements included in the first multi-stage amplifier circuit 220, but “N-type transistor” may refer to a transistor configured such that an N-channel is formed.

A gate of the second stage N-type transistor TN1 may be connected to a 1-1-th capacitor C1-1 connected to an output terminal of the first stage amplifier circuit 210 through a first node n1. A drain terminal of the second stage N-type transistor TN1 may be connected to a gate of the third stage N-type transistor TN2 and a source of the bias N-type transistor TBN through a second node n2. In some example embodiments, a source of the second stage N-type transistor TN1 may be grounded.

A source of the bias N-type transistor TBN may be connected to a drain of the second stage N-type transistor TN1 through the second node n2, a gate of the bias N-type transistor TBN may be connected to a 1-2-th capacitor C1-2 and a 1-3-th switch SW1-3 through a third node n3, and a drain of the bias N-type transistor TBN may be connected to a 1-1-th switch SW1-1, a 1-4-th switch SW1-4, and a 2-6-th switch SW2-6 through the fourth node n4.

The second stage N-type transistor TN1 and the bias N-type transistor TBN may correspond to a second stage S2 of the first multi-stage amplifier circuit 220.

A gate of the third stage N-type transistor TN2 may be connected to a drain of the second stage N-type transistor TN1 through the second node n2, and a drain of the third stage N-type transistor TN2 may be connected to a 1-3-th switch SW1-3, a 1-5-th switch SW1-5, and a 1-7-th switch SW1-7 through a fifth node n5. In some example embodiments, the source of the third stage N-type transistor TN2 may be grounded.

The first multi-stage amplifier circuit 220 may include the 1-1-th switch to the 1-7-th switch SW1-1 to SW1-7 that may correspond to the above-described dynamic switching circuit. In some example embodiments, a dynamic switching circuit of a stage of the first multi-stage amplifier circuit 220 including the 1-1-th switch to the 1-7-th switch SW1-1 to SW1-7 may be defined as a first dynamic switching circuit.

The 1-1-th switch SW1-1 may have one end, connected to one end of the 1-1-th capacitor C1-1 and a gate of the second stage N-type transistor TN1 through the first node n1, and the other end connected to a 1-1-th current source IS1-1 through the fourth node n4 and the 1-4-th switch SW1-4 and connected to a drain of the bias N-type transistor TBN. The 1-2-th switch SW1-2 may have one end, connected to a drain of the second stage N-type transistor TN1, a gate of the third stage N-type transistor TN2, and a source of the bias N-type transistor TBN through the second node n2, and the other end connected to a 1-2-th current source IS1-2. The 1-3-th switch SW1-3 may have one end, connected to a gate of the bias N-type transistor TBN and the 1-2-th capacitor C1-2, and the other end connected to a drain of the third stage N-type transistor TN2 through the fifth node n5.

The 1-1-th switch and the 1-3-th switch SW1-1 and SW1-3 may sample a bias voltage across the 1-1-th capacitor C1-1 and the 1-2-th capacitor C1-2 while dynamically operating in the first and second phases.

The 1-4-th switch SW1-4 may have one end, connected to the drain of the bias N-type transistor TBN through the fourth node n4, and the other end connected to the 1-1-th current source IS1-1. The 1-5-th switch SW1-5 may have one end, connected to the drain of the third stage N-type transistor TN2 through the fifth node n5, and the other end connected to the 1-3-th current source IS1-3.

The 1-2-th switch SW1-2 and the 1-4-th switch to the 1-5-th switch SW1-4 to SW1-5 may supply the bias current from the 1-1-th current source to the 1-3-th current source IS1-1 to IS1-3 or block the supply of the bias current while dynamically operating in the first and second phases.

The 1-6-th switch SW1-6 may be included in the first multi-stage amplifier circuit 220 and may have one end, connected to the drain of the second stage N-type transistor TN1 through the second node n2, and the other end connected to the second multi-stage amplifier circuit 230. For example, the other end of the 1-6-th switch SW1-6 may be connected to the drain of the bias P-type transistor TBP included in the second multi-stage amplifier circuit 230.

The 1-7-th switch SW1-7 may be included in the first multi-stage amplifier circuit 220 and may have one end, connected to the drain of the third stage N-type transistor TN2 through the fifth node n5, and the other end connected to an output terminal of the first multi-stage amplifier circuit 220 and the second multi-stage amplifier circuit 230 (for example, an output node no at which the output voltage Vout is output).

The 1-6-th switch to the 1-7-th switch SW1-6 to SW1-7 may allow the first multi-stage amplifier circuit 220 and the second multi-stage amplifier circuit 230 to perform amplification operations while dynamically operating in the first and second phases.

The second multi-stage amplifier circuit 230 may be configured to be symmetrical with respect to the first multi-stage amplifier circuit 220.

For example, the second multi-stage amplifier circuit 230 may include a second stage P-type transistor TP1, a third stage P-type transistor TP2, and a bias P-type transistor TBP. The term "P-type" is used to distinguish elements included in the second multi-stage amplifier circuit 230, but "P-type transistor" may refer to a transistor configured such that a P-channel is formed.

A gate of the second stage P-type transistor TP1 may be connected to the 2-1-th capacitor C2-1 connected to the output terminal of the first stage amplifier circuit 210 through the sixth node n6. A drain of the second stage P-type transistor TP1 may be connected to a gate of the third stage P-type transistor TP2 and a source of the bias P-type transistor TBP through the seventh node n7. In some example embodiments, a supply voltage may be supplied to a source of the second stage P-type transistor TP1.

The source of the bias P-type transistor TBP may be connected to a drain of the second stage P-type transistor TP1 through the seventh node n7, the gate of the bias P-type transistor TBP may be connected to the 2-2-th capacitor C2-2 and the second-3 switch SW2-3 through the eighth node n8, and the drain of the bias P-type transistor TBP may be connected to a 2-1-th switch SW2-1 through a ninth node n9, a 2-4 switch SW2-4, and the 1-6-th switch SW1-6.

The second stage P-type transistor TP1 and the bias P-type transistor TBP may correspond to a second stage of the second multi-stage amplifier circuit 230.

The gate of the third stage P-type transistor TP2 may be connected to the drain of the second stage P-type transistor TP1 through the seventh node n7, and the drain of the third stage P-type transistor TP2 may be connected to a 2-7-th switch SW2-7 through a tenth node n10. In some example embodiments, a supply voltage may be supplied to a source of the third stage P-type transistor TP2.

The second multi-stage amplifier circuit 230 may include a 2-1-th switch to a 2-7-th switch SW2-1 to SW2-7 which may correspond to the above-described dynamic switching circuit. In some example embodiments, a dynamic switching circuit of a stage of the second multi-stage amplifier circuit 230 including the 2-1-th switch to the 2-7-th switch SW2-1 to SW2-7 may be defined as a second dynamic switching circuit.

The 2-1-th switch SW2-1 may have one end, connected to one end of the 2-1-th capacitor C2-1 and the gate of the second stage P-type transistor TP1 through the sixth node n6, and the other end connected to a 2-1-th current source IS2-1 through the ninth node n9 and the 2-1-th switch SW2-1. The 2-2-th switch SW2-2 may have one end, connected to the drain of the second-stage P-type transistor TP1, the gate of the third-stage P-type transistor TP2, and the source of the bias P-type transistor TBP through node n7, and the other end connected to a 2-2-th current source IS2-2. The 2-3 switch SW2-3 may have one end, connected to the gate of the bias P-type transistor TBP and the 2-2-th capacitor C2-2 through the eighth node n8, and the other end connected to a drain of the third stage P-type transistor TP2 through the tenth node n10.

The 2-1-th switch and the second-3 switch SW2-1 and SW2-3 may sample a bias voltage across the 2-1-th capacitor C2-1 and the 2-2-th capacitor C2-2 while dynamically operating in the first and second phases.

The 2-4-th switch SW2-4 may have one end, connected to the drain of the bias P-type transistor TBP through the ninth node n9, and the other end connected to a 2-1-th current source IS2-1. The 2-5-th switch SW2-5 may have one end, connected to the drain of the third stage P-type transistor TP2 through the tenth node n10, and the other end connected to a 2-3-th current source IS2-3.

The 2-2-th switch SW2-2 and the 2-4-th switch and the 2-5-th switch SW2-4 and SW2-5 may supply bias current from the 2-1-th current source to the 2-3-th current source IS2-1 to IS2-3 or block the supply of the bias current while dynamically operating in the first and second phases.

The 2-6-th switch SW2-6 may be included in the second multi-stage amplifier circuit 230 and may have one end, connected to the drain of the second stage P-type transistor TP1 through the seventh node n7, and the other end connected to the first multi-stage amplifier circuit 220. For example, the other end of the 2-6-th switch SW2-6 may be connected to the drain of the bias N-type transistor TBN included in the first multi-stage amplifier circuit 220 through the fourth node n4.

The 2-7-th switch SW2-7 may be included in the second multi-stage amplifier circuit 230 and may have one end, connected to the drain of the third stage P-type transistor TP2 through the tenth node n10, and the other end connected to the output node no.

The 2-6-th switch and the 2-7-th switch SW2-6 and SW2-7 may allow the first multi-stage amplifier circuit 220 and the second multi-stage amplifier circuit 230 to perform amplification operations while dynamically operating in the first and second phases.

Figure 6:
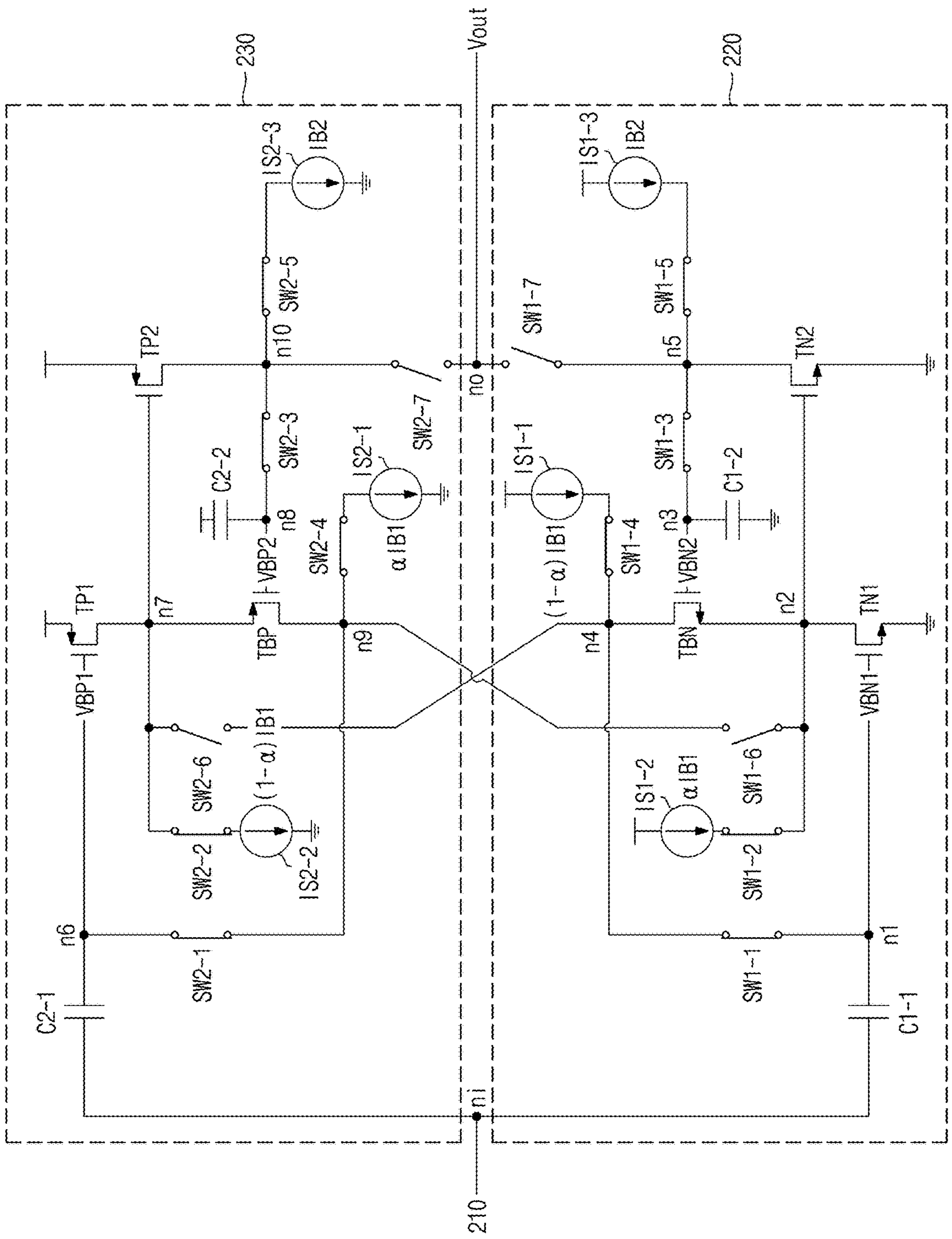
FIG. 6 is a diagram illustrating a first phase operation of an amplifier of FIG. 5 according to some example embodiments.

FIG. 6 is a diagram illustrating a first phase operation of an amplifier of FIG. 5 according to some example embodiments.

Referring to FIG. 6, in a first phase for biasing, the 1-1-th switch to the 1-5-th switch SW1-1 to SW1-5 included in the first multi-stage amplifier circuit 220 may be turned on, and the 1-6-th switch to the 1-7-th switch SW1-6 to SW1-7 included in the first multi-stage amplifier circuit 220 may be turned off. Similarly, the 2-1-th switch to the second-5 switch SW2-1 to SW2-5 included in the second multi-stage amplifier circuit 230 may be turned on, and a 2-6-th switch to a 2-7-th switch SW2-6 to SW2-7 included in the second multi-stage amplifier circuit 230 may be turned off.

Each of the first multi-stage amplifier circuit 220 and the second multi-stage amplifier circuit 230 may operate as a current mirror to flow bias current to each stage. In the first phase, the first node n1 and the fourth node n4 may be short-circuited and the sixth node n6 and the ninth node n9 may also be short-circuited as the 1-1-th switch SW1-1, the 1-2-th switch SW1-2, the 1-4-th switch SW1-4, the 2-1-th switch SW2-1, the 2-2-th switch SW2-2, and the second-4 switch SW2-4 are turned on. A portion (for example, $(1-\alpha)$ IB1) of the first bias current from the 1-1-th current source IS1-1 through the fourth node n4 and a portion ($\alpha$IB1) of the first bias current from the 1-2-th current source IS1-2 through the second node n2 may be supplied to the drain of the second stage N-type transistor TN1. Accordingly, the first bias voltage VBN1 corresponding to the first bias current may be sampled across one end of the 1-1-th capacitor C1-1.

Similarly, a portion (for example, $\alpha$IB1) of the first bias current may be output to the first current source IS2-1 through the ninth node n9, and a portion (for example, $(1-\alpha)$IB1) of the first bias current may be output to the second current source IS2-2 through the seventh node n7.

The first bias voltage VBP1 corresponding to the first bias current IB1 may be sampled across one end of the 2-1-th capacitor C2-1.

Returning to FIG. 4, in the first phase, a common mode voltage VCM may be applied to the input nx of the first stage amplifier circuit 210 to generate an output common mode voltage and an output offset of the first stage amplifier circuit 210 at the output node i (ni). Thus, the 1-1-th capacitor C1-1 and the 2-1-th capacitor C2-1 may sample the output common mode voltage and the output offset of the first stage amplifier circuit 210, so that the output offset of the first stage amplifier circuit 210 may be canceled in the second phase amplification operation.

Returning to FIG. 6, the 1-3-th current source IS1-3 may supply second bias current (for example, IB2) to the drain of the third stage N-type transistor TN2 through the fifth node n5, and a second bias voltage VBN2 corresponding to the second bias current may be sampled across the 1-2-th capacitor C1-2. Similarly, the 2-3-th current source IS2-3 may supply second bias current (for example, IB2) to the drain of the third stage P-type transistor TP2 through the tenth node n10, and the second bias voltage VBP2 corresponding to the second bias current may be sampled across the 2-2-th capacitor C2-2.

According to some example embodiments, in the first phase, the bias N-type transistor TBN and the second stage N-type transistor TN1 and the bias P-type transistor TBP and the second stage P-type transistor TP1 may operate as flipped voltage followers through a dynamic switching circuit. For example, the bias N-type transistor TBN and the bias P-type transistor TBP may operate as a flipped voltage follower using a portion of the first bias current as a reference current source and the second stage N-type transistor TN1 as feedback. For example, the first dynamic switching circuit may be configured to operate the bias N-type transistor TBN as a flipped voltage follower based on short-circuiting the drain of the bias N-type transistor TBN and the gate of the second stage N-type transistor TN1 in the first phase. The second dynamic switching circuit may be configured to operate the bias P-type transistor TBP as a flipped voltage follower based on short-circuiting the drain of the bias P-type transistor TBP and the gate of the second stage P-type transistor TP1 in the first phase.

Accordingly, the bias N-type transistor TBN may output a voltage, which is decreased by a gate-source voltage of the bias N-type transistor TBN from the second bias voltage VBN2 sampled across the 1-2-th capacitor C1-2, to the second node n2. The bias P-type transistor TBP may output a voltage, which is higher than the second bias voltage VBP2 sampled across the 2-2-th capacitor C2-2 by the source-gate voltage of the bias P-type transistor TBP, to the seventh node n7. As a result, the bias N-type transistor TBN and the second stage N-type transistor TN1 and the bias P-type transistor TBP and the second stage P-type transistor TP1 may form a feedback loop through the third stage N-type transistor TN2 and the third stage P-type transistor TP2 operating as a common source amplifier while operating as flipped voltage followers, and may sample the second bias voltages VBN2 and VBP2 across the 1-2-th capacitor C1-2 and the 2-2-th capacitor C2-2.

According to the sampling, the second stage N-type transistor TN1 and the second stage P-type transistor TP1 may be biased with the first bias voltages VBN1 and VBP1, the bias N-type transistor TBN and the bias P-type transistor TBP may be biased with the second bias voltages VBN2 and VBP2, the third stage N-type transistor TN2 may be biased with a voltage that is decreased by the gate-source voltage of the bias N-type transistor TBN from the second bias voltage VBN2, and the third stage P-type transistor TP2 may be biased with a voltage that is increased by the source-gate voltage of the bias P-type transistor TBP from the second bias voltage VBP2. Accordingly, the third stage N-type transistor TN2 and the third stage P-type transistor TP2 may operate in a sub-threshold region as they are biased with the second bias current IB2.

Figure 7:
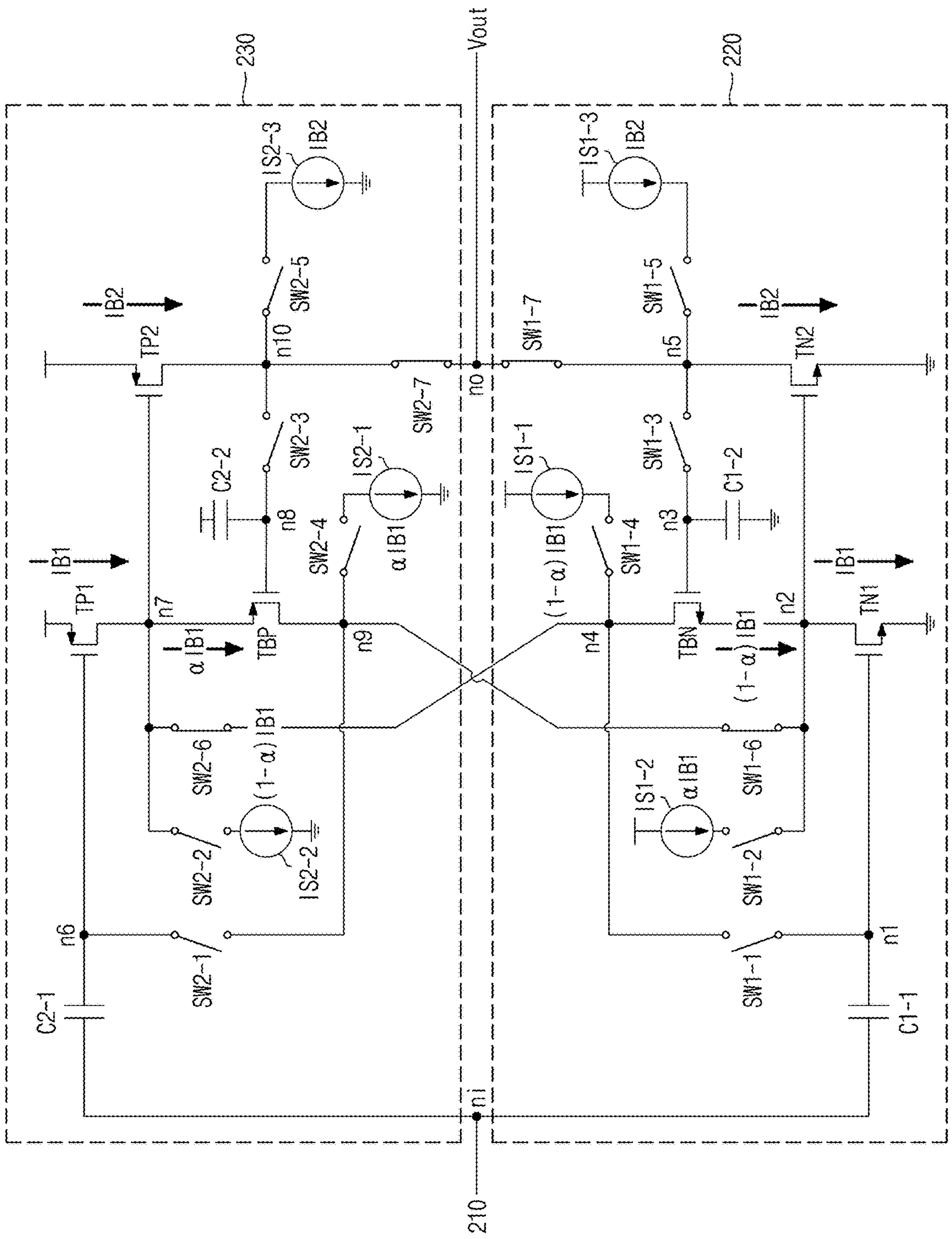
FIG. 7 is a diagram illustrating a second phase operation of the amplifier of FIG. 5 according to some example embodiments.

FIG. 7 is a diagram illustrating a second phase operation of the amplifier of FIG. 5 according to some example embodiments. For ease of description, the example embodiments of FIG. 7 will be described without distinguishing N-type and P-type, except where necessary.

Referring to FIG. 7, in the second phase for amplification, the first to fifth switches SW1-1 to SW1-5 and SW2-1 to SW2-5 included in the first multi-stage amplifier circuit 220 may be turned off, and the sixth to seventh switches SW1-6 to SW1-7 and SW2-6 to SW2-7 may be turned on.

Based on the first to third switches SW1-1 to SW1-3 being turned off in the second phase, the second stage transistors TN1 and TP1 may be biased with a voltage corresponding to the first bias current IB1, and the third stage transistors TN2 and TP2 may be biased with a voltage corresponding to the second bias current IB2. For example, when each multi-stage amplifier circuit reaches a steady state in the second phase, gate voltages of the second stage transistors TN1 and TP1 may be biased with the first bias voltage sampled in the first phase. Each of the biased second stage transistors TN1 and TP1 may flow the first bias current IB1.

In some example embodiments, each of the bias N-type transistor TBN and the bias P-type transistor TBP may operate as a floating current source flowing the portion (1−α)IB1 or αIB1 of the first bias current IB1. In terms of each multi-stage amplifier circuit, the second node n2 may be connected to the ninth node n9 and the fourth node n4 may be connected to the seventh node n7 based on the sixth switch SW1-6 and SW2-6 being turned on in the second phase. Each of the biased bias transistors TBN and TBP may flow a portion of the first bias current IB1 through a path along which multi-stage amplifiers are connected through the second node n2 or the fourth node n4.

Each of the third stage transistors TN2 and TP2 may be biased with gate and source voltages of the third N-type bias transistor TN2 or source and gate voltages of the third stage P-type transistor TP2, in addition to the sampled second bias voltage. As described above, in some example embodiments, as the 1-7-th switch SW1-7 and the second-7 switch SW2-7 are turned on in the second phase, each of the third stage transistors TN2 and TP2 may flow the second bias current IB2. Each of the biased third stage transistors TN2 and TP2 may operate in the sub-threshold region through biasing.

In the above-described example embodiments of FIGS. 5 to 7, each current source is illustrated as being included in each multi-stage amplifier circuit, but may be provided outside a multi-stage amplifier circuit. Each current source may be turned off in the second phase through switches (for example, the 1-2-th switch SW1-2, the 1-4-th switch SW1-4, the 1-5-th switch SW1-5, the 2-2-th switch SW2-2, the 2-4-th switch SW2-4, and the 2-5-th switch SW2-5) connected to each current source, so that power consumption may be reduced.

According to the above-described example embodiments, an amplifier may form a dominant pole, for example, in the third stage by biasing each of the second and third stages through a dynamic switching operation. As a result, the amplifier may secure stability and operate with low power.

In some example embodiments, the third stage transistor may operate in the sub-threshold region based on biasing through a bias transistor in the second stage of each multi-stage amplifier circuit. When the third stage transistor operates in the sub-threshold region through a voltage-resistor drop caused by a resistor using the resistor between the second stage transistors, an amplifier may oscillate or a bandwidth of the amplifier may decrease depending on a resistance value. In some example embodiments, the above issues may be addressed by using a bias transistor rather than a resistor and biasing desired current.

In some example embodiments, a mismatch between elements may be addressed by providing switches for a dynamically operating current mirror, rather than a replica current mirror, in the second stage transistor and the third stage transistor. Through a dynamic current mirror operation, the amplifier according to some example embodiments may perform process-voltage-temperature (PVT) tracking without calibration.

Figure 8:
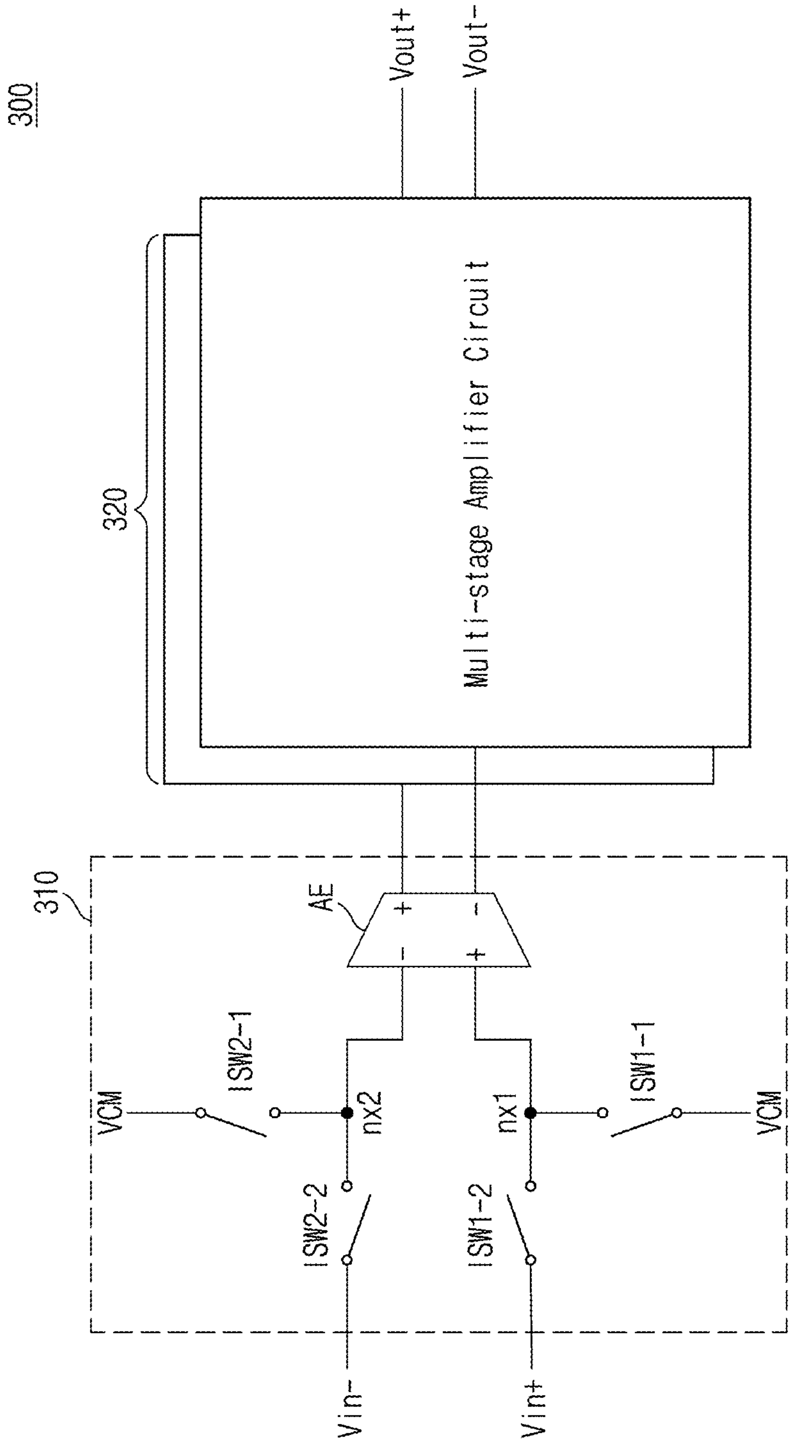
FIG. 8 is a diagram illustrating a differential amplifier according to some example embodiments.

FIG. 8 is a diagram illustrating a differential amplifier according to some example embodiments.

Referring to FIG. 8, a differential amplifier 300 according to some example embodiments may include a first stage amplifier circuit 310 and a plurality of multi-stage amplifier circuits 320.

The first stage amplifier circuit 310 may receive a differential input voltage pair Vin+ and Vin−, and may amplify the differential input voltage pair Vin+ and Vin− with a gain required for a first stage and provide the amplified voltage pair to the plurality of multi-stage amplifier circuits 320.

The first stage amplifier circuit 310 may include an amplifying element AE, a 1-1-th input switch ISW1-1, a 1-2-th input switch ISW1-2, a 2-1-th input switch ISW2-1, and a 2-2-th input switch ISW2-2.

Input terminals of the amplifying element AE may be connected to the 1-1-th input switch ISW1-1, the 1-2-th input switch ISW1-2, the 2-1-th input switch ISW2-1, and the 2-2-th input switch ISW2-2 through a node x1 (nx1) and a node x2 (nx2), and an output terminal of the amplifying element AE may be connected to an input node of the multi-stage amplifier circuit 320. The amplifying element AE may amplify the applied differential input voltage pair Vin+ and Vin−, and may output the amplified voltage pair to the plurality of multi-stage amplifier circuits 320.

The 1-1-th input switch ISW1-1 may be connected to the node x1 (nx1) and the 2-1-th input switch ISW2-1 may be connected to the node x2 (nx2) to apply a common mode voltage VCM to the amplifying element AE. The 1-1-th input switch ISW1-1 and the 2-1-th input switch ISW2-1 may be turned on in a first phase. As a result, an output common mode voltage and an output offset of the first stage amplifier circuit 310 may be applied to each of the plurality of multi-stage amplifier circuits 320 through the amplifying element AE.

The 1-2-th input switch ISW1-2 may be connected to the node x1 (nx1) and the 2-2-th input switch ISW2-2 may be connected to the node x2 (nx2) to apply the differential input voltage pair Vin+ and Vin− to the amplifying element AE. The 1-1-th input switch ISW1-2 and the 2-2-th input switch ISW2-2 may be turned off in the first phase and turned on in the second phase to apply the differential input voltage pair Vin+ and Vin− for an amplification operation to the amplifying element AE.

Each of the plurality of multi-stage amplifier circuits 320 may be implemented according to the above-described example embodiments of FIGS. 5 to 7. A differential output voltage pair Vout+ and Vout− for the differential input voltage pair Vin+ and Vin− may be output from each of the plurality of multi-stage amplifier circuits 320.

For example, each of the plurality of multi-stage amplifier circuits 320 may branch off from an output terminal of the first stage amplifier circuit 310 and may include a first multi-stage amplifier circuit and a second multi-stage amplifier circuit, respectively including a second stage and a third stage. Each of the first multi-stage amplifier circuit and the second multi-stage amplifier circuit may be configured to sample a voltage corresponding to first bias current corresponding to the second stage and a voltage corresponding to second bias current corresponding to the third stage in the first phase, and to bias the second stage with a voltage corresponding to the first bias current in the second phase and bias the third stage with a voltage corresponding to the second bias current.

The multi-stage amplifier circuit, the amplifier, and/or the differential amplifier according to the above-described example embodiments may be used in an analog-to-digital converter (ADC) using a switched-capacitor (SC) amplifier, such as a pipeline ADC, a pipeline successive approximation register (SAR) ADC, or a cyclic ADC.

The multi-stage amplifier circuit, the amplifier, and/or the differential amplifier according to the above-described example embodiments may also be used in an ADC using an SC integrator, such as a discrete time delta-signal ADC.

In some example embodiments, the multi-stage amplifier circuit, amplifier, and/or differential amplifier according to some example embodiments may be provided in at least two. At least two amplifier units may be connected in parallel. At least two amplifier units connected in parallel may operate in opposite phases. At least two amplifier units may be used as an error amplifier of a low-dropout regulator.

As set forth above, according to some example embodiments, a multi-stage amplifier circuit for dynamic biasing may be provided.

As described herein, any devices, electronic devices, modules, units, and/or portions thereof according to any of the example embodiments, and/or any portions thereof may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, units, and/or portions thereof according to any of the example embodiments.

While some example embodiments have been shown and described above, it will be apparent to those skilled in the art that modifications and variations could be made without departing from the scope of the present inventive concepts as defined by the appended claims.

What is claimed is:

1. A multi-stage amplifier circuit, comprising:

a first multi-stage amplifier circuit and a second multi-stage amplifier circuit, the first multi-stage amplifier circuit including a second stage N-type transistor connected to a first stage through a 1-1-th capacitor connected to a gate of the second stage N-type transistor, a bias N-type transistor connected to a drain of the second stage N-type transistor and having a gate connected to a 1-2-th capacitor, a third stage N-type transistor having a gate connected to the drain of the second stage N-type transistor, a first current circuit configured to supply a first bias current and a second bias current, and a first dynamic switching circuit connected to the second stage N-type transistor, the bias N-type transistor, the third stage N-type transistor, and the first current circuit and configured to sample a voltage corresponding to the first bias current across the 1-1-th capacitor in a first phase and sample a voltage corresponding to the second bias current across the 1-2-th capacitor based on forming a feedback loop comprising the bias N-type and the third stage N-type transistor, and the second multi-stage amplifier circuit including a second stage P-type transistor connected to the first stage through a 2-1-th capacitor connected to a gate of the second stage P-type transistor, a bias P-type transistor connected to a drain of the second stage P-type transistor and having a gate connected to a 2-2-th capacitor, a third stage P-type transistor having a gate connected to the drain of the second stage P-type transistor, a second current circuit configured to supply the first bias current and the second bias current, and a second dynamic switching circuit connected to the second stage P-type transistor, the bias P-type transistor, the third stage P-type transistor, and the second current circuit and configured to sample a voltage corresponding to the first bias current across the 2-1-th capacitor in the first phase and sample a voltage corresponding to the second bias current across the 2-2-th capacitor based on forming a feedback loop comprising the second stage P-type transistor, the bias P-type transistor, and the third stage P-type transistor.

2. The multi-stage amplifier circuit of claim 1, wherein the first dynamic switching circuit is configured to bias the second stage N-type transistor with a voltage corresponding to the first bias current and bias the bias N-type transistor and the third stage N-type transistor with a voltage corresponding to the second bias current, in a second phase defined for the multi-stage amplifier circuit such that the multi-stage amplifier circuit is configured to perform an amplification operation, and the second dynamic switching circuit is configured to bias the second stage P-type transistor with a voltage corresponding to the first bias current and bias the bias P-type transistor and the third stage P-type transistor with a voltage corresponding to the second bias current, in the second phase.

3. The multi-stage amplifier circuit of claim 2, wherein the second stage N-type transistor and the second stage P-type transistor are configured to flow the first bias current based on the biasing; and the third stage N-type transistor and the third stage P-type transistor are configured to flow the second bias current based on the biasing.

4. The multi-stage amplifier circuit of claim 1, wherein the first dynamic switching circuit includes a 1-1-th switch connected to the gate of the second stage N-type transistor, the 1-1-th capacitor, and a drain of the bias N-type transistor, a 1-2-th switch connected to the drain of the second stage N-type transistor, a source of the bias N-type transistor, and the first current circuit, a 1-3-th switch connected to the gate of the bias N-type transistor, the 1-2-th capacitor, and a drain of the third stage N-type transistor, a 1-4-th switch connected to the drain of the bias N-type transistor and the first current circuit, a 1-5-th switch connected to the drain of the third stage N-type transistor and the first current circuit, a 1-6-th switch connected to the drain of the second stage N-type transistor and the second multi-stage amplifier circuit, and a 1-7-th switch connected to the drain of the third stage N-type transistor and output terminals of the first multi-stage amplifier circuit and the second multi-stage amplifier circuit, and the second dynamic switching circuit including a 2-1-th switch connected to the gate of the second stage P-type transistor, the 2-1-th capacitor, and a drain of the bias P-type transistor, a 2-2-th switch connected to the drain of the second stage P-type transistor, a source of the bias P-type transistor, and the second current circuit, a 2-3-th switch connected to the gate of the bias P-type transistor, the 2-2-th capacitor, and a drain of the third stage P-type transistor, a 2-4-th switch connected to the drain of the bias P-type transistor and the second current circuit, a 2-5-th switch connected to the drain of the third stage P-type transistor and the second current circuit, a 2-6-th switch connected to the drain of the second stage P-type transistor and the first multi-stage amplifier circuit, and a 2-7-th switch connected to the drain of the third stage P-type transistor and the output terminals of the first multi-stage amplifier circuit and the second multi-stage amplifier circuit.

5. The multi-stage amplifier circuit of claim 4, wherein the 1-1-th switch to the 1-5-th switch and the 2-1-th switch to the 2-5-th switch are configured to turn on in the first phase, and the 1-6-th switch and the 1-7-th switch and the 2-6-th switch and the 2-7-th switch are configured to turn off in the first phase.

6. The multi-stage amplifier circuit of claim 4, wherein the first current circuit includes a 1-1-th current source connected to a first end of the 1-1-th switch and the drain of the bias N-type transistor and configured to supply a first portion of the first bias current;

a 1-2-th current source connected to a first end of the 1-2-th switch and configured to supply a second portion of the first bias current; and a 1-3-th current source connected to a first end of the 1-5-th switch and the drain of the third stage N-type transistor and configured to supply the second bias current.

7. The multi-stage amplifier circuit of claim 4, wherein
the 1-1-th switch to the 1-5-th switch and the 2-1-th switch to the 2-5-th switch are configured to turn off in a second phase defined for the multi-stage amplifier circuit such that the multi-stage amplifier circuit is configured to perform an amplification operation, and
the 1-6-th switch and the 1-7-th switch and the 2-6-th switch and the 2-7-th switch are configured to turn on in the second phase.

8. The multi-stage amplifier circuit of claim 6, wherein
the second current circuit includes
a 2-1-th current source connected to a first end of the 2-1-th switch and the drain of the bias P-type transistor and configured to supply the second portion of the first bias current;
a 2-2-th current source connected to a first end of the 2-2-th switch and configured to supply the first portion of the first bias current; and
a 2-3-th current source connected to a first end of the 2-5-th switch and the drain of the third stage P-type transistor and configured to supply the second bias current.

9. The multi-stage amplifier circuit of claim 8, wherein
a second end of the 1-1-th switch is connected to a first end of the 1-1-th capacitor and the gate of the second stage N-type transistor through a first node;
a second end of the 1-2-th switch is connected to the source of the bias N-type transistor and the drain of the second stage N-type transistor through a second node;
a second end of the 1-3-th switch is connected to the gate of the bias N-type transistor and a first end of the 1-2-th capacitor through a third node;
the first end of the 1-1-th switch is connected to the 1-1-th current source through a fourth node and the 1-4-th switch;
the first end of the 1-2-th switch is connected to the 1-2-th current source;
a first end of the 1-3-th switch is connected to the 1-3-th current source through a fifth node and the 1-5-th switch;
a second end of the 2-1-th switch is connected to a first end of the 2-1-th capacitor and the gate of the second stage P-type transistor through a sixth node;
a second end of the 2-2-th switch is connected to the source of the bias P-type transistor and the drain of the second stage P-type transistor through a seventh node;
a second end of the 2-3-th switch is connected to the gate of the bias P-type transistor and a first end of the 2-2-th capacitor through an eighth node;
the first end of the 2-1-th switch is connected to the 2-1-th current source through a ninth node and the 2-4-th switch;
the first end of the 2-2-th switch is connected to the 2-2-th current source; and
a first end of the 2-3-th switch is connected to the 2-3-th current source through a tenth node and the 2-5-th switch.

10. The multi-stage amplifier circuit of claim 1, wherein
the first dynamic switching circuit is configured to operate the bias N-type transistor as a flipped voltage follower based on short-circuiting the drain of the bias N-type transistor and the gate of the second stage N-type transistor in the first phase, and
the second dynamic switching circuit is configured to operate the bias P-type transistor as a flipped voltage follower based on short-circuiting the drain of the bias P-type transistor and the gate of the second stage P-type transistor in the first phase.

11. An amplifier, comprising:
a first stage amplifier circuit configured to receive an input voltage; and
a first multi-stage amplifier circuit and a second multi-stage amplifier circuit branching off from an output terminal of the first stage amplifier circuit and each comprising a second stage and a third stage,
each of the first multi-stage amplifier circuit and the second multi-stage amplifier circuit configured to sample a voltage corresponding to a first bias current corresponding to the second stage and a voltage corresponding to a second bias current corresponding to the third stage in a first phase, and bias the second stage with the voltage corresponding to the first bias current and bias the third stage with the voltage corresponding to the second bias current in a second phase.

12. The amplifier of claim 11, wherein
each of the first multi-stage amplifier circuit and the second multi-stage amplifier circuit comprises:
a second stage transistor having a gate connected to a first capacitor connected to the output terminal of the first stage amplifier circuit;
a bias transistor having a source connected to a drain of the second stage transistor and a gate connected to a second capacitor; and
a third stage transistor having a gate connected to the drain of the second stage transistor.

13. The amplifier of claim 12, wherein
each of the first multi-stage amplifier circuit and the second multi-stage amplifier circuit comprises:
a first switch having a first end connected to a first end of the first capacitor and the gate of the second stage transistor;
a second switch having a first end connected to the drain of the second stage transistor and the source of the bias transistor, and a second end connected to a second current source;
a third switch having a first end connected to the gate of the bias transistor and the second capacitor, and a second end connected to a drain of the third stage transistor;
a fourth switch having a first end connected to a drain of the bias transistor and a second end of the first switch, and a second end connected to a first current source; and
a fifth switch having a first end connected to the drain of the third stage transistor, and a second end connected to a third current source.

14. The amplifier of claim 13, wherein
the bias transistor and the second stage transistor are configured to operate as a flipped voltage follower as the first switch is configured to turn on.

15. The amplifier of claim 13, wherein
each of the first multi-stage amplifier circuit and the second multi-stage amplifier circuit further comprises:
a sixth switch included in one of the first multi-stage amplifier circuit or the second multi-stage amplifier circuit and having a first end connected to the drain of the second stage transistor, and a second end connected to another of the first multi-stage amplifier circuit or the second multi-stage amplifier circuit; and
a seventh switch included in one of the first multi-stage amplifier circuit or the second multi-stage amplifier circuit and having a first end connected to the drain of the third stage transistor, and a second end connected to another of the first multi-stage amplifier circuit or the second multi-stage amplifier circuit.

16. The amplifier of claim 13, wherein the first switch to the fifth switch are configured to turn on in the first phase and turn off in the second phase.

17. The amplifier of claim 15, wherein the sixth switch and the seventh switch are configured to turn off in the first phase and turn on in the second phase.

18. The amplifier of claim 13, wherein the first switch to the fifth switch are configured to sample a voltage corresponding to the first bias current across the first capacitor and sample a voltage corresponding to the second bias current across the second capacitor, based on the first switch and the fifth switch being configured to turn on in the first phase.

19. The amplifier of claim 13, wherein the first switch to the fifth switch are configured to bias the second stage transistor with a voltage corresponding to the first bias current and bias the bias transistor with a voltage corresponding to the second bias current, based on the first switch to the fifth switch being configured to turn off in the second phase.

20. A differential amplifier, comprising:

a first stage amplifier circuit configured to receive a differential input voltage pair; and a plurality of multi-stage amplifier circuits configured to output a differential voltage output pair for the differential input voltage pair, each of the plurality of multi-stage amplifier circuits including a first multi-stage amplifier circuit and a second multi-stage amplifier circuit branching off from an output terminal of the first stage amplifier circuit and each comprising a second stage and a third stage, and each of the first multi-stage amplifier circuit and the second multi-stage amplifier circuit configured to sample a voltage corresponding to a first bias current corresponding to the second stage and a voltage corresponding to a second bias current corresponding to the third stage in a first phase, and bias the second stage with the voltage corresponding to the first bias current and the third stage with the voltage corresponding to the second bias current in a second phase.

* * * * *